(12) United States Patent
Shen et al.

(10) Patent No.: US 9,571,114 B1
(45) Date of Patent: Feb. 14, 2017

(54) SAR ADC PERFORMANCE OPTIMIZATION WITH DYNAMIC BIT TRIAL SETTINGS

(71) Applicant: Analog Devices, Inc., Norwood, MA (US)

(72) Inventors: Junhua Shen, Wilmington, MA (US); Edward C. Guthrie, Charlestown, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 15/019,430

(22) Filed: Feb. 9, 2016

(51) Int. Cl.
*H03M 1/06* (2006.01)
*H03M 1/42* (2006.01)
*H03M 1/46* (2006.01)
*H03M 1/12* (2006.01)

(52) U.S. Cl.
CPC ......... *H03M 1/0612* (2013.01); *H03M 1/1245* (2013.01); *H03M 1/42* (2013.01); *H03M 1/46* (2013.01)

(58) Field of Classification Search
CPC ............................... H03M 1/0612; H03M 1/42
USPC .................... 341/155, 163, 172, 118, 120
See application file for complete search history.

(56) References Cited

U.S. PATENT DOCUMENTS

| | | | | |
|---|---|---|---|---|
| 2002/0075081 A1* | 6/2002 | Tang | .................... | H03K 3/0231 331/16 |
| 2008/0084340 A1* | 4/2008 | Hurrell | ............... | H03M 1/0641 341/131 |

FOREIGN PATENT DOCUMENTS

JP WO 2014038198 * 3/2014 .......... H03M 1/0678

OTHER PUBLICATIONS

Hong, Hyeok-Ki, et al., "A 2.6/b/cycle-Architecture-Based 10b 1.7GS/s 15.4mW $4^x$-Time-Interleaved SAR ADC with a Multistep Hardware-Retirement Technique", ISSCC 2015 / Session 26, (2015), 3 pgs.
Kapusta. Ron, et al., "A 14b 80 MS/s SAR ADC With 73.6 dB SNDR in 65 nm CMOS", IEEE Journal of Solid-State Circuits, vol. 48, No. 12, (Dec. 2013), 8 pgs.
Liu, Chun-Cheng, et al., "A 10b 100MS/s 1.13mW SAR ADC with Binary-Scaled Error Compensation", ISSCC 2010 / Session 21, (2010), 3 pgs.

* cited by examiner

*Primary Examiner* — Peguy Jean Pierre
(74) *Attorney, Agent, or Firm* — Schwegman Lundberg & Woessner, P.A.

(57) ABSTRACT

An analog-to-digital converter (ADC) circuit comprises a digital-to-analog (DAC) circuit including at least N+n weighted circuit components, wherein N and n are positive integers greater than zero, and n is a number of repeat bits of the least significant bit (LSB) of the ADC circuit; a sampling circuit configured to sample an input voltage at an input to the ADC circuit and apply a sampled voltage to the weighted circuit components; a comparator circuit configured to compare an output voltage of the DAC to a specified threshold voltage during a bit trial; and logic circuitry configured to perform bit trials for the at least N+n weighted circuit components and adjust one or more parameters for one or more of N bit trials according to values of the n LSB repeat bits.

20 Claims, 5 Drawing Sheets

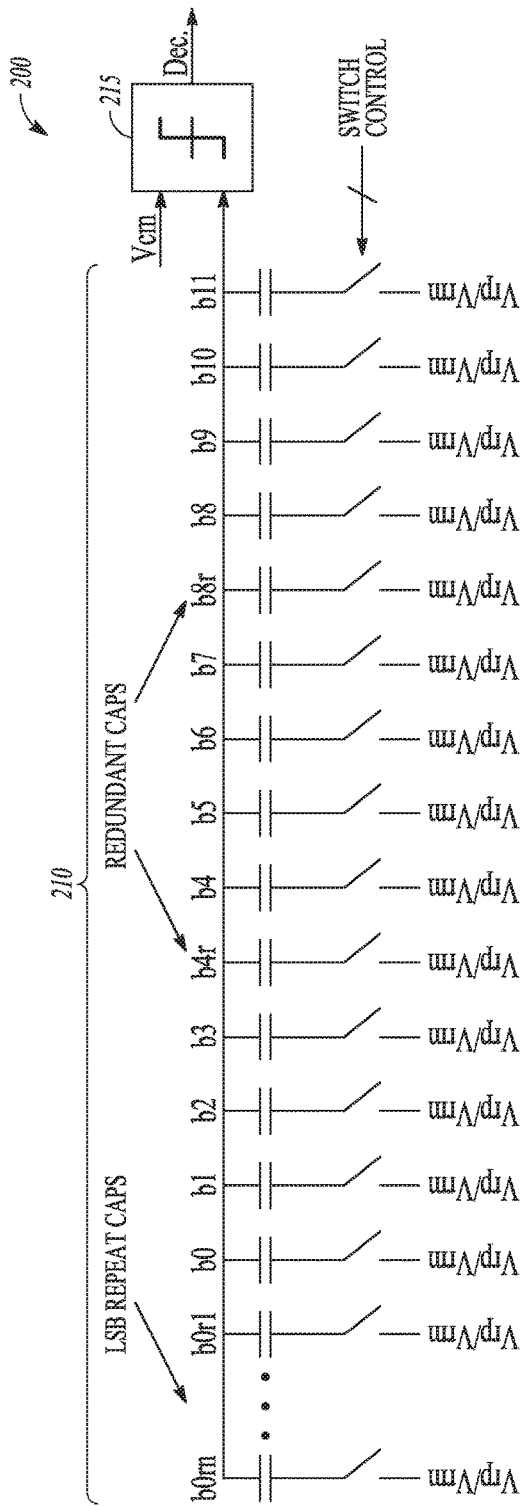
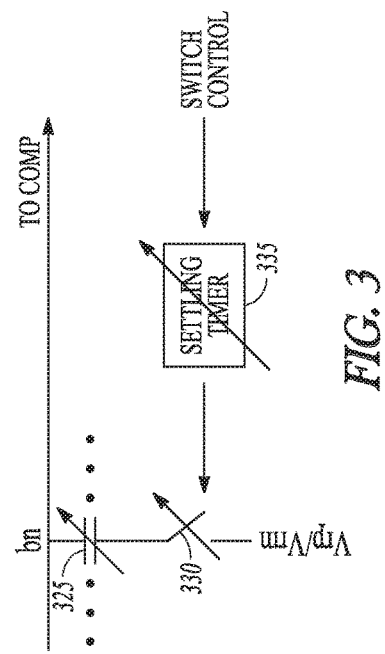
FIG. 2
FIG. 3

SAR ADC PERFORMANCE OPTIMIZATION WITH DYNAMIC BIT TRIAL SETTINGS

BACKGROUND

Successive approximation register (SAR) analog-to-digital converters (ADCs) typically resolve bits sequentially from most-significant bit (MSB) to least-significant bit (LSB) for each conversion. It can be a challenge to accurately determine the LSBs of a higher accuracy ADC (e.g., such as when the number of bits in the ADC is twelve or greater) and minimize conversion errors. The present inventors have recognized a need for SAR ADCs that are more robust and efficient for the bit trials performed during the conversion phase of the SAR ADCs.

OVERVIEW

This document relates generally to analog-to-digital converter (ADC) circuits and more particularly to SAR ADC circuits. An example ADC circuit includes a digital-to-analog (DAC) circuit including at least N+n weighted circuit components, wherein N and n are positive integers greater than zero, and n is a number of repeat bits of the least significant bit (LSB) of the ADC circuit; a sampling circuit configured to sample an input voltage at an input to the ADC circuit and apply a sampled voltage to the weighted circuit components; a comparator circuit configured to compare an output voltage of the DAC to a specified threshold voltage during a bit trial; and logic circuitry configured to perform bit trials for the at least N+n weighted circuit components and adjust one or more parameters for one or more of N bit trials according to values of the n LSB repeat bits.

This section is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIG. 2 is a circuit diagram of portions of an example of an ADC circuit.

FIG. 3 is a circuit schematic for one bit of the DAC circuit.

DETAILED DESCRIPTION

As explained previously herein, SAR ADCs typically resolve bits sequentially from MSB to LSB for each conversion of an input voltage that is sampled and held. Unlike pipelined ADCs, where the requirement for MSB conversion is more stringent, the performance of SAR ADC is often limited by the LSB conversions, and the performance of SAR ADCs is more tolerant of MSB errors. To take advantage of this characteristic, SAR ADCs can be implemented with low accuracy MSBs and high accuracy LSBs. Another approach is to include redundant bits in the SAR ADC, so that the SAR ADC is more tolerant of decision errors in earlier bits (e.g., MSBs) in the conversion.

Figure 1:
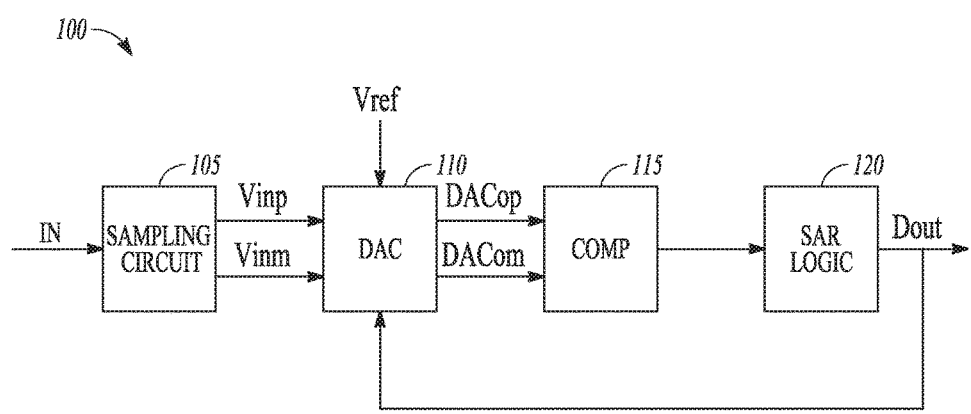
FIG. 1 is a functional block diagram of an example of an SAR ADC.

FIG. 1 is a functional block diagram of an example of an SAR ADC 100. In the example, a differential analog input voltage is sampled and held using sampling circuit 105, and a differential output voltage of a DAC circuit 110 is compared to the sampled and held voltage using comparator circuit 115. The bit values of the DAC circuit 110 are adjusted based on the output of the comparator circuit. The conversion may start with the DAC set to midscale. The comparator 115 determines whether the DAC output is greater or less than the sampled input voltage and the result is stored as a one or zero for that bit of the DAC. Conversion then proceeds to the next bit value until all bits of the digital value are determined. One iteration of changing the DAC output and comparing the voltage to the sampled input can be referred to as a bit trial. SAR logic circuitry 120 controls the ADC operation during the bit trials. When the bit trials are complete, the digital value of the sampled and held voltage is available at output Dout.

FIG. 2 is a circuit diagram of portions of an example of an ADC circuit 200. The ADC circuit includes a 12-bit DAC circuit 210, but the number of bits N may vary (e.g., 16-bits) in different implementations. A single ended DAC is shown in the example for simplicity, but the actual implementation of the ADC may be a fully differential DAC.

The bit positions of the DAC are represented by weighted circuit components. In the example, the weighted circuit components are capacitors, and the value of capacitance of the capacitors provides the weight of the component. In some examples, the circuit components are weighted according to a radix-2 numbering system. In some examples, the circuit components are weighted according to a non-radix-2 numbering system (e.g., radix-1.9 or radix-1.7).

The DAC circuit 210 includes a number n repeat bits of LSB bit b0, or n LSB repeats, labeled b0r1 to b0rn, and the number n of repeat bits may vary in different implementations. The number of LSB repeats may vary and they may follow other bits as well. In some examples, the DAC circuit 210 includes bit repeats of bits lower than the LSB of the DAC circuit. For instance, the repeat bits could be weighted half of the weight of the LSB (e.g., sub-LSBs bs11 . . . bs1n), a quarter of the weight of the LSB (sub-LSBs bs1, bs21 . . . bs2n), or one-eighth of the weight of the LSB (sub-LSBs bs1, bs2, bs31 . . . bs3n).

In some examples, the DAC circuit includes r weighted circuit components, wherein r is a number of redundant bits for bits that higher order than the LSB. In the example of FIG. 1, the DAC circuit 210 includes redundant bits for bit eight and bit four, labeled b8r and b4r respectively, to signify that the redundant bits are weighted the same as bits b8 and b4. The number of redundant bits and the positions of them are not necessarily restricted to the example shown in FIG. 2.

A sampling circuit (not shown) samples the input voltage at the input to the ADC circuit and applies the sampled input voltage to the weighted circuit components. The ADC circuit includes a comparator circuit 215 that compares an output voltage of the DAC circuit 210 to a specified threshold voltage during a bit trial. If the DAC circuit is a differential DAC circuit, the sampling circuit samples a differential input voltage, and the comparator circuit compares a differential output voltage of the DAC circuit to the specified threshold voltage. The ADC circuit includes logic circuitry (not shown) to control operation for the bit trials. The logic circuitry may include a state machine to progress the ADC circuit through the bit trials, or may include a processor performing instructions to progress the ADC through the bit trials. The bit trials are performed for the N bits of the DAC circuit, and may include bit trials for one or both of the LSB repeats and the r redundant bits.

Because SAR ADCs are more tolerant of errors for the MSB trials, the repeat bits and redundant bits can be used to recover from decision errors from the earlier trials. The decision errors could be from incomplete bit trial settling, comparator input referred offset change from trial to trial, etc. Hardcode optimization for bit trial parameter settings for each bit may be impractical due to process, temperature and voltage variations.

The information extracted from repeat bit decisions and redundant bit decisions can be used to minimize ADC error and optimize SAR ADC performance. The logic circuitry may adjust one or more parameters for one or more of N bit trials according to values of bit decisions determined for one or both of the n LSB repeat bits and the r redundant bits. The performance of each bit trial or a sub-group of the N bit trials can be optimized independently. The parameter change may optimize one or more of the speed, power, and signal to noise ratio (SNR) of one or more bit trials of the ADC circuit.

The operation of the LSB repeats of the ADC circuit will be described first. To improve performance, the bit pattern or other statistic of the LSB repeat bits decisions are analyzed and used to adjust settings for the bit trials. In some examples, the logic circuitry initiates a number of conversions (e.g., P conversions to generate P N-bit digital values (P>1)). The statistic is then determined for the results of the conversions. For an ideal SAR ADC circuit in the presence of noise, after all the regular bit trials (b11:b0), the DAC output (or comparator input) residue is close to 0, which is a function of the LSB magnitude and noise level. If there is excessive decision error from the regular bit trials, the DAC output residue would on average be larger than otherwise, essentially resulting in a degraded SNR.

To improve performance, patterns of all 0s or all 1s for the first k LSB repeats (k≤n, where n is the number of LSB repeat bits) may be searched for in the results of a number of conversions. The patterns may occur due to incomplete settling of the bit trials (because of large time constant, from incomplete settling of glitch coupling, etc.) resulting in bit decision errors. Using the detected patterns, the settling time for bits b4r-b0 (or other sub-group of the bit trials) can be adjusted until the frequency with which the bit pattern occurs falls below a predetermined threshold frequency.

Other than the bit patterns, another example of a statistic is the standard deviation of the sum of decisions of the LSB repeats over a number of the conversions. A least mean square (LMS) loop can be determined by the logic circuitry and used to drive down the standard deviation, e.g., by controlling b4r-b0's settling times. As explained previously, the statistic determined for the conversions can be used to optimize bit settling for one or more bit trials. For instance, the settling time for bits b4r-b0 may be deceased to improve speed, if the statistic for the LSB repeats indicate that the settling time is more than sufficient.

FIG. 3 is a circuit schematic for one bit of the DAC circuit 210. The circuit includes a capacitor 325 with adjustable capacitance, a switch circuit 330, and a settling time timer 335 controlled by a switch control signal. It can be seen from FIG. 3 that the bit trial settling time can be changed by changing one or more of the timing of the settling time timer, the impedance of the switch circuit 330, and the capacitance of the capacitor. Although changing the capacitance of the capacitor has implications on bit-weights, and thus may not be a preferred option.

The operation of the redundant bits of the ADC circuit 200 of FIG. 2 will now be described. As with the LSB repeat bits, a statistic of the decisions of the redundant bit trials for a number of conversions are analyzed and used to adjust settings for the bit trials to improve performance. In some examples, the statistic is how often the redundant bits are actually used to correct earlier bit decision errors. A redundant bit is used when its corresponding bit makes an incorrect decision. If the redundant bits are not used often, then one or more parameters of the earlier bit trials can be relaxed to either improve speed, power, or both speed and power.

Figure 4A:
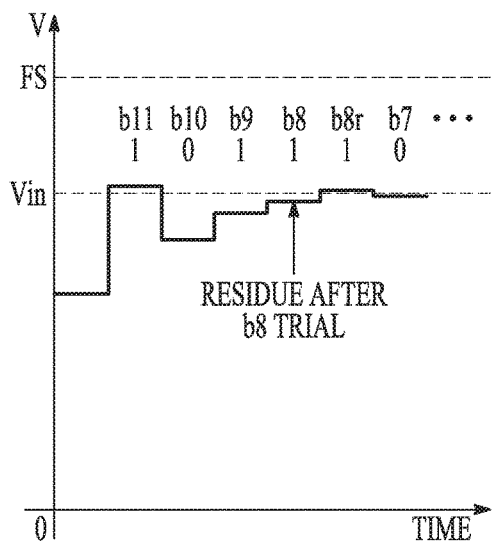
FIGS. 4A-4D illustrate examples of operation of ADC circuit bit trials.
Figure 4B:
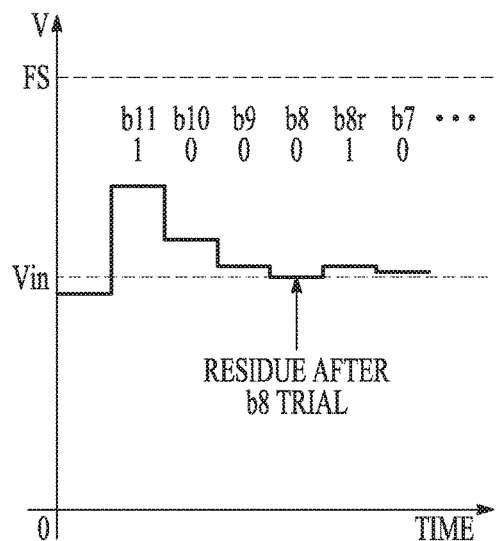

FIGS. 4A-4D illustrate examples of operation of an ADC circuit useful for showing an example of determining when a redundant bit is used. The examples are for redundant bit b8r of FIG. 2 where it is assumed that the capacitors are binary weighted. FIGS. 4A and 4B illustrate that after the corresponding DAC bit b8 settles, and if the ADC is ideal, the residue of the conversion is effectively within the b8 weight of input value Vin (or within the sum of weights of b7:b0). Otherwise the ADC wouldn't converge without redundant bits, even if b7:b0 all decide the same polarity.

Figure 4C:
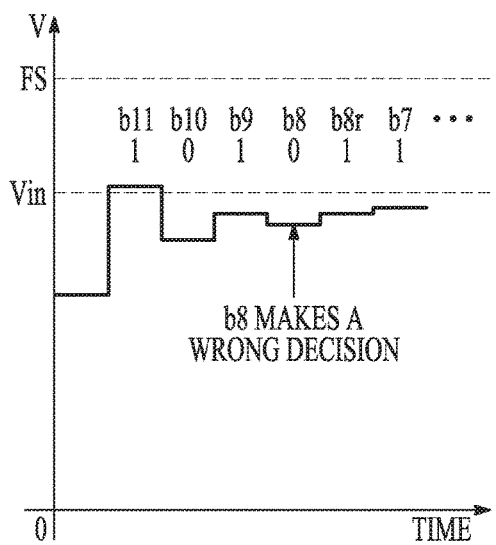
Figure 4D:
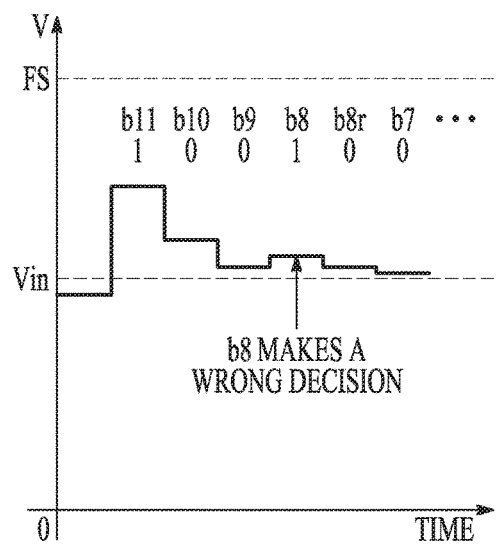

Knowing this property, we know after b8r is trialed, the residue voltage will cross the dotted line corresponding to Vin. Thus, bit b7 must decide the opposite of bit b8r (e.g., 1 vs. 0), and this is also shown in FIGS. 4A and 4B. On the other hand, if one of b11-b8r makes the wrong decision, (e.g., the bit trial of b8 makes the wrong decision as shown in FIGS. 4C and 4D), then bits b8r and b7 will inevitably make the same decision (e.g., both 1s or both 0s). Thus, it can be determined whether a redundant bit is used if it agrees with the DAC bit having the next lower order DAC weight. Thus, in some examples, the statistic used in adjustment of bit trials is the number of times that the values of the redundant bit match the values of the bit determined immediately lower in order than the redundant bit.

In a practical ADC where noise is present and the bit capacitors may be mismatched a bit, the pattern described above won't be true 100% of the time. Even if there is no decision errors from b11-b8r, b8r and b7 may still make the same decision because of noise, though the probability is very low because noise level is usually almost negligible compared to those bit weights. Information can be extracted from these patterns of matching or not matching. For instance, if b8r and b7 rarely make same decision, the redundant bit b8r is not being used much at all. On the other extreme, if b8r and b7 mostly make the same decision, bit b8r is being used often and this may suggest that decision error from earlier bit trials may be too big to be tolerated. In some examples, a programmable threshold of how often b8r and b7 make the same decision can be specified, and parameter setting for the bit trial of one or more of bits b11-b8r can be optimized (e.g., by the logic circuitry) for one or both of speed and power until the threshold is hit.

Speed and power of a bit trial can be optimized by optimizing the bit trial settling time. As explained above in regard to FIG. 3, the bit settling time can be changed by changing one or more of the timing of a settling time timer, the impedance of the switch circuit, and the capacitance of the capacitor. Other methods of optimizing speed and power can be used.

Figure 5:
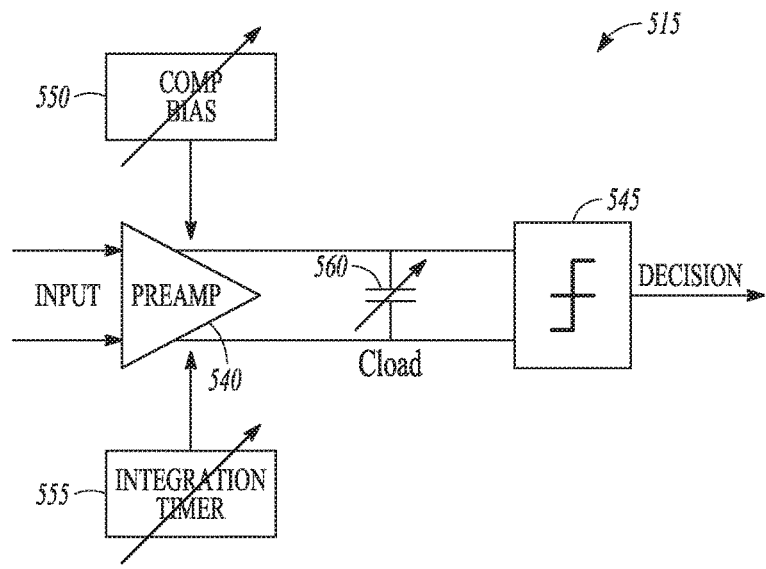
FIG. 5 shows an example of portions of a comparator circuit.

FIG. 5 shows an example of portions of a comparator circuit 515 that includes a preamplifier 540 and a latch 545. In some examples, comparator bias current 550 can be adjusted to minimize power consumption while minimizing wrong bit decisions. In some examples, an integration timer circuit 555 of the comparator 515 is adjusted to improve speed without hurting ADC noise performance. In some examples, the preamplifier's loading capacitance 560 is adjusted to optimize power and speed. The described servo loop can be adjusted with any of these three example knobs (bias current, integration time, and capacitive load) because adjusting any one of them would affect comparator input referred offset and noise, and the offset and noise typically change in a monotonic fashion. If either or both the offset and the noise go up, the decision error rate will go up, and thus b8$r$ and b7 will make the same decision more often, allowing for performance to be optimized either automatically or manually.

The dynamic bit trial and parameter setting method can be applied to each redundant bit and the next lower order bit after, as well as to the LSB repeat trials. For instance, in the example of FIG. 2, bit trial settings for bits b11-b8$r$ can be automatically or manually optimized, either individually or as a group, based on patterns of bits b8$r$ and b7. Bit trials for bits b7-b4$r$, or any bit trials before b3, can be optimized by observing the patterns for b4$r$ and b3; and bit trials for b3-b0, or any bit trials before the LSB repeat bits, can be optimized based on the LSB repeat bit decisions. It is to be noted that less than all of the bit trials can have parameters adjusted. Although the aforementioned comparator settings and bit trial settling times could be adjusted for bits b3-b0, this may not be desired in practice because changing comparator settings could affect the ADC circuit noise and the LSB trials largely determine the ADCs susceptibility to noise.

Figure 6:
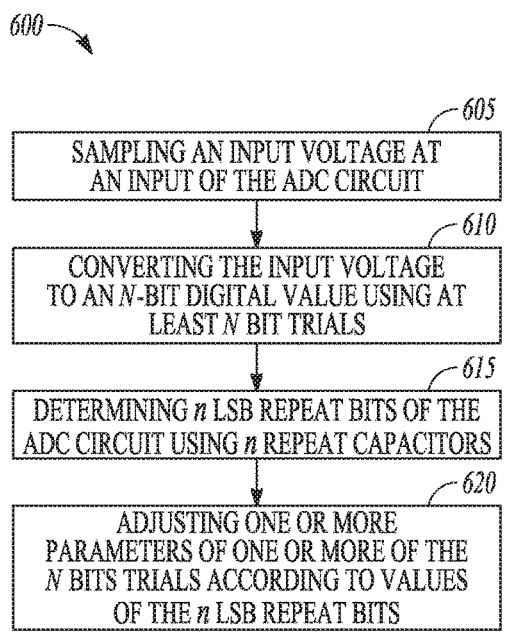
FIG. 6 is a flow diagram of an example of a method of operating an ADC circuit.

FIG. 6 is a flow diagram of an example of a method 600 of operating an ADC circuit. At 605, an input voltage is sampled at an input of the ADC circuit. The ADC circuit may be an SAR ADC. In some examples, the ADC circuit is a differential ADC circuit, and the sampled input voltage is a differential input voltage.

At 610, the sampled input voltage is converted to an N-bit digital value using at least N bit trials, wherein N is a positive integer. In some examples, P conversions of input voltages are performed to generate P N-bit digital values, wherein P is a positive integer greater than one (P>1).

At 615, n LSB repeat bits of the LSB of the ADC circuit are determined using n repeat capacitors, where n is a positive integer greater than zero. At 620, one or more parameters of one or more of the N bit trials are adjusted according to values of the n LSB repeat bits.

According to some examples, a statistic is calculated over the P conversions for values of the n LSB repeat bits generated by the P conversions, and the one or more parameters are adjusted according to the calculated statistic. In some examples, the statistic includes a frequency of occurrence of k consecutive one bits or k consecutive zero bits in the n LSB repeat bits, wherein k is a positive integer greater than zero and less than or equal to n ($0 < k \leq n$). The frequency of occurrence may be compared to a threshold value and the one or more parameters may be adjusted when the frequency of occurrence satisfies the threshold value. In some examples, the statistic includes a standard deviation of a sum of at least a portion of decisions for the LSB repeat bits determined for the P conversions. The standard deviation can be compared to a threshold value and adjusting the one or more parameters when the standard deviation satisfies the threshold value.

In some examples, a parameter of one or more bit trials is adjusted to adjust one or both of speed of the bit trial and power used during the bit trial. In some examples, a settling time of a DAC circuit used for one or more bit trials is adjusted according to values of the n LSB repeat bits. A bit trial may include comparing the sampled input voltage to a reference voltage using a comparator circuit. In some examples, one or more of a bias current of the comparator circuit, an integration time of a preamplifier of the comparator circuit, and a load capacitance of the preamplifier is adjusted according to the statistic to change one or both of speed of the bit trial and power used during the bit trial.

Figure 7:
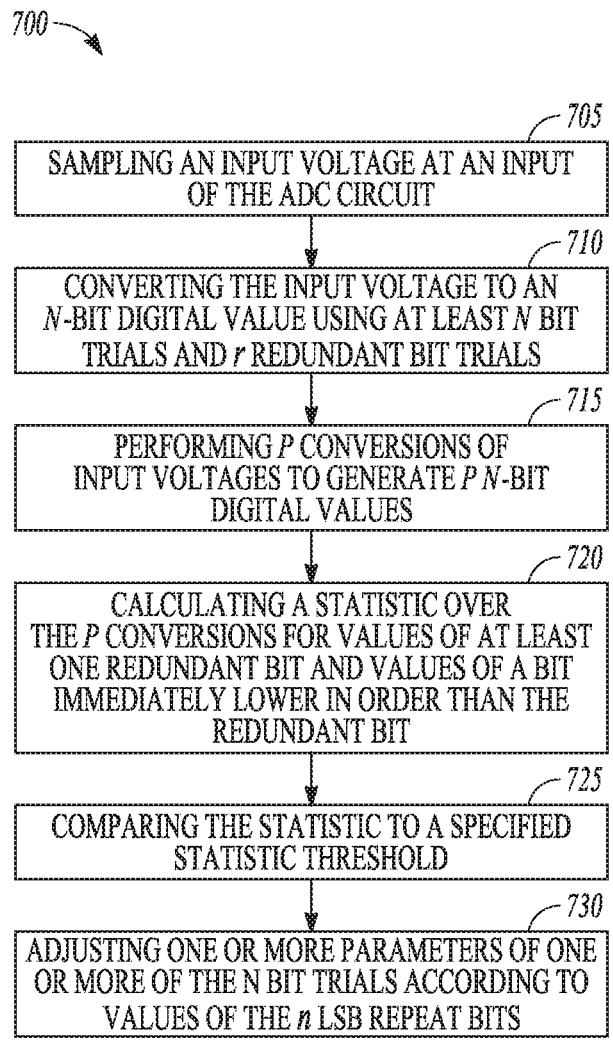
FIG. 7 is a flow diagram of another example of a method of operating an ADC circuit.

FIG. 7 is a flow diagram of another example of a method 700 of operating an ADC circuit. At 705, an input voltage is sampled at an input of the ADC circuit. The ADC circuit may be an SAR ADC. In some examples, the ADC circuit is a differential ADC circuit.

At 710, converting the sampled input voltage is converted to an N-bit digital value using N bit trials and r redundant bit trials, where N is a positive integer and r is a positive integer less than N and greater than zero (N>r>0). At 715, P conversions of input voltages are performed to generate P N-bit digital values, where P is a positive integer greater than one (P>1).

At 720, a statistic is calculated over the P conversions for values of at least one redundant bit and values of a bit immediately lower in order than the redundant bit. In some examples, the statistic is a number of times that the values of the at least one redundant bit matches the values of the bit determined immediately lower in order than the redundant bit. At 725, the determined statistic is compared to a threshold value, and the one or more parameters of the one or more bit trials are adjusted when the determined number satisfies the threshold value At 730, one or more parameters of one or more bit trials of one or more bits immediately higher in order than the at least one redundant bit is adjusted according to the calculated statistic. In some examples, a parameter is changed to adjust one or both of speed of the bit trial and power used during a bit trial according to the calculated statistic. In some examples, the ADC circuit includes a DAC circuit used for the bit trials, and a settling time of the DAC circuit is adjusted according to the statistic. The bit trials may include successively comparing the output voltage of the DAC circuit to a specified threshold voltage using a comparator circuit. In some examples, one or more of bias current of the comparator, an integration time of a pre-amplifier included in the comparator, and a load capacitance of the pre-amplifier are adjusted according to the calculated statistic. In some examples, the methods of FIGS. 6 and 7 are combined and statistics are calculated for the repeat bits and redundant bits and parameters can be adjusted accordingly.

The results of the measurements of the methods and devices described can be used to adjust parameters of one or more of the bit trials to optimize performance. The parameters can be adjusted automatically (e.g., using logic circuitry) or adjusted manually.

ADDITIONAL DESCRIPTION AND EXAMPLES

Example 1 includes subject matter (such as an ADC circuit) comprising: a digital-to-analog (DAC) circuit including at least N+n weighted circuit components, wherein N and n are positive integers greater than zero, and in is a number of repeat bits of the least significant bit (LSB) of the ADC circuit; a sampling circuit configured to sample an input voltage at an input to the ADC circuit and apply a sampled voltage to the weighted circuit components; a comparator circuit configured to compare an output voltage of the DAC to a specified threshold voltage during a bit trial; and logic circuitry configured to perform bit trials for the at least N+n weighted circuit components and adjust one or more parameters for one or more of N bit trials according to values of the n LSB repeat bits.

In Example 2, the subject matter of Example 1 optionally includes logic circuitry is configured to: initiate P conversions of voltages at the input to the ADC circuit to generate P N-bit digital values, wherein P is a positive integer greater than one (P>1); calculate a statistic over the P conversions for values of the in LSB repeat bits generated by the P conversions; and adjust the one or more parameters according to the calculated statistic.

In Example 3, the subject matter of one or both of Examples 1 and 2 optionally include logic circuitry configured to calculate, as the statistic, a frequency of occurrence of k consecutive one bits or k consecutive zero bits in the n LSB repeat bits, wherein k is a positive integer greater than zero and less than or equal to n (0<k≤n).

In Example 4, the subject matter of Example 3 optionally includes logic circuitry configured to compare the frequency of occurrence to a threshold value and adjust the one or more parameters when the frequency of occurrence satisfies the threshold value.

In Example 5, the subject matter of one or any combination of Examples 1-4 optionally includes logic circuitry configured to calculate, as the statistic, a standard deviation of a sum of at least a portion of decisions for the LSB repeat bits determined for the P conversions.

In Example 6, the subject matter of Example 5 optionally includes logic circuitry configured to compare the standard deviation to a threshold value and adjust the one or more parameters when the standard deviation satisfies the threshold value.

In Example 7, the subject matter of one or any combination of Examples 1-6 optionally includes logic circuitry configured to adjust a settling time of a digital-to-analog converter (DAC) circuit used for one or more of the N bit trials according to values of the n LSB repeat bits.

In Example 8, the subject matter of one or any combination of Examples 1-7 optionally includes logic circuitry configured to change at least one of a bias current of the comparator circuit, an integration time of a preamplifier of the comparator circuit, and a load capacitance of the preamplifier according to values of the n LSB repeat bits.

In Example 9, the subject matter of one or any combination of Examples 1-8 optionally includes r weighted circuit components, wherein r is a number of redundant bits of the N bits and r is a positive integer greater than zero, and wherein the logic circuitry is optionally configured to: convert the input voltage to an N-bit digital value using at least N bit trials and r redundant bit trials; initiate P conversions of input voltages to generate P N-bit digital values, wherein P is a positive integer greater than one (P>1); calculate a statistic over the P conversions for values of at least one redundant bit and values of a bit determined immediately lower in order than the redundant bit; compare the statistic to a specified statistic threshold; and adjust a parameter of a bit trial of one or more bits higher in order than the at least one redundant bit according to the calculated statistic and the values of the n LSB repeat bits.

Example 10 includes subject matter (such as a method, a means for performing acts, or a device-readable medium including instructions that, when performed by the device, cause the device to perform acts), or can optionally be combined with the subject matter of one or any combination of Examples 1-9 to include such subject matter, comprising sampling an input voltage at an input of the ADC circuit; converting the input voltage to an N-bit digital value using at least N bit trials, wherein N is a positive integer; determining n least significant bit (LSB) repeat bits of the LSB of the ADC circuit using n repeat capacitors, wherein n is a positive integer greater than zero; and adjusting one or more parameters of one or more of the N bit trials according to values of the n LSB repeat bits.

In Example 11, the subject matter of claim 10 optionally includes performing P conversions of voltages at the input to the ADC circuit to generate P N-bit digital values, wherein P is a positive integer greater than one (P>1); calculating a statistic over the P conversions for values of the n LSB repeat bits generated by the P conversions; and adjusting the one or more parameters according to the calculated statistic.

In Example 12, the subject matter of Example 11 optionally includes calculating a statistic that includes a frequency of occurrence of k consecutive one bits or k consecutive zero bits in the n LSB repeat bits, wherein k is a positive integer greater than zero and less than or equal to n (0<k≤n).

In Example 13, the subject matter of Example 12 optionally includes comparing the frequency of occurrence to a threshold value and adjusting the one or more parameters when the frequency of occurrence satisfies the threshold value.

In Example 14, the subject matter of one or any combination of Examples 11-13 optionally includes calculating a statistic that includes a standard deviation of a sum of at least a portion of decisions for the LSB repeat bits determined for the P conversions.

In Example 15, the subject matter of one or any combination of Examples 10-14 optionally includes a bit trial that includes comparing the sampled input voltage to a reference voltage using a comparator circuit, and wherein adjusting one or more parameters for one or more N-bit trials includes adjusting one or more of a bias current of the comparator circuit, an integration time of a preamplifier of the comparator circuit, and a load capacitance of the preamplifier.

Example 16 includes subject matter (such as an ADC circuit) or can optionally be combined with the subject matter of one or any combination of Examples 1-15 to include such subject matter, comprising: a digital-to-analog (DAC) circuit including at least N+r weighted circuit components, wherein N and r are positive integers greater than zero, and r is a number of redundant bits of the N bits; a sampling circuit configured to sample an input voltage at an input to the ADC circuit and apply a sampled voltage to the weighted circuit components; a comparator circuit configured to compare an output voltage of the DAC circuit to a specified threshold voltage as part of a bit trial; and logic circuitry configured to: convert the input voltage to an N-bit digital value using at least N bit trials and r redundant bit trials; initiate P conversions of input voltages to generate P N-bit digital values, wherein P is a positive integer greater than one (P>1); calculate a statistic over the P conversions for values of at least one redundant bit and values of a bit determined immediately lower in order than the redundant bit; compare the statistic to a specified statistic threshold;

and adjust a parameter of a bit trial of one or more bits higher in order than the at least one redundant bit according to the calculated statistic.

In Example 17, the subject matter of Example 16 optionally includes logic circuitry configured to determine, as the statistic, a number of times that the values of the at least one redundant bit match the values of the bit determined immediately lower in order than the redundant bit.

In Example 18, the subject matter of one or both of Examples 16 and 17 optionally includes logic circuitry configured to; compare the determined number of times to a specified threshold value; and adjust the one or more parameters of the one or more bit trials according to the comparison.

In Example 19, the subject matter of one or any combination of Examples 16-17 optionally includes a settling time timer circuit configured to time a settling time duration of the DAC circuit, and wherein the logic circuitry is configured to adjust the settling time duration according to the calculated statistic.

In Example 20, the subject matter of one or any combination of Examples 16-19 optionally includes logic circuitry configured to adjust one or more of bias current of the comparator, an integration time of a pre-amplifier included in the comparator, and a load capacitance of the pre-amplifier according to the calculated statistic.

Example 21 can include, or can optionally be combined with any portion or combination of any portions of any one or more of Examples 1-20 to include, subject matter that can include means for performing any one or more of the functions of Examples 1-20, or a machine-readable medium including instructions that, when performed by a machine, cause the machine to perform any one or more of the functions of Examples 1-20.

These non-limiting examples can be combined in any permutation or combination.

The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects. Method examples described herein can be machine or computer-implemented at least in part.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. An analog-to-digital converter (ADC) circuit comprising:
   a digital-to-analog (DAC) circuit including at least N+n weighted circuit components, wherein N and n are positive integers greater than zero, and n is a number of repeat bits of the least significant bit (LSB) of the ADC circuit;
   a sampling circuit configured to sample an input voltage at an input to the ADC circuit and apply a sampled voltage to the weighted circuit components;
   a comparator circuit configured to compare an output voltage of the DAC to a specified threshold voltage during a bit trial; and
   logic circuitry configured to perform bit trials for the at least N+n weighted circuit components and adjust one or more parameters for one or more of N bit trials according to values of the n LSB repeat bits.

2. The ADC circuit of claim 1, wherein the logic circuitry is configured to:
   initiate P conversions of voltages at the input to the ADC circuit to generate P N-bit digital values, wherein P is a positive integer greater than one (P>1);
   calculate a statistic over the P conversions for values of the n LSB repeat bits generated by the P conversions; and
   adjust the one or more parameters according to the calculated statistic.

3. The ADC circuit of claim 1, wherein the logic circuitry is configured to calculate, as the statistic, a frequency of occurrence of k consecutive one bits or k consecutive zero bits in the n LSB repeat bits, wherein k is a positive integer greater than zero and less than or equal to n (0<k≤n).

4. The ADC circuit of claim 3, wherein the logic circuitry is configured to compare the frequency of occurrence to a threshold value and adjust the one or more parameters when the frequency of occurrence satisfies the threshold value.

5. The ADC circuit of claim 1, wherein the logic circuitry is configured to calculate, as the statistic, a standard deviation of a sum of at least a portion of decisions for the LSB repeat bits determined for the P conversions.

6. The ADC circuit of claim 5, wherein the logic circuitry is configured to compare the standard deviation to a threshold value and adjust the one or more parameters when the standard deviation satisfies the threshold value.

7. The ADC circuit of claim 1, wherein the logic circuitry is configured to adjust a settling time of a digital-to-analog converter (DAC) circuit used for one or more of the N bit trials according to values of the n LSB repeat bits.

8. The ADC circuit of claim 1, wherein the logic circuitry is configured to change at least one of a bias current of the comparator circuit, an integration time of a preamplifier of the comparator circuit, and a load capacitance of the preamplifier according to values of the n LSB repeat bits.

9. The ADC circuit of claim 1, including:
r weighted circuit components, wherein r is a number of redundant bits of the N bits and r is a positive integer greater than zero, and wherein the logic circuitry is configured to:
convert the input voltage to an N-bit digital value using at least N bit trials and r redundant bit trials;
initiate P conversions of input voltages to generate P N-bit digital values, wherein P is a positive integer greater than one (P>1);
calculate a statistic over the P conversions for values of at least one redundant bit and values of a bit determined immediately lower in order than the redundant bit;
compare the statistic to a specified statistic threshold; and
adjust a parameter of a bit trial of one or more bits higher in order than the at least one redundant bit according to the calculated statistic and the values of the n LSB repeat bits.

10. A method of operating an analog to digital converter (ADC) circuit, the method comprising:
sampling an input voltage at an input of the ADC circuit;
converting the input voltage to an N-bit digital value using at least N bit trials, wherein N is a positive integer;
determining n least significant bit (LSB) repeat bits of the LSB of the ADC circuit using n repeat capacitors, wherein n is a positive integer greater than zero; and
adjusting one or more parameters of one or more of the N bit trials according to values of the n LSB repeat bits.

11. The method of claim 10, including:
performing P conversions of voltages at the input to the ADC circuit to generate P N-bit digital values, wherein P is a positive integer greater than one (P>1);
calculating a statistic over the P conversions for values of the n LSB repeat bits generated by the P conversions; and
adjusting the one or more parameters according to the calculated statistic.

12. The method of claim 11, wherein the statistic includes a frequency of occurrence of k consecutive one bits or k consecutive zero bits in the n LSB repeat bits, wherein k is a positive integer greater than zero and less than or equal to n ($0 < k \leq n$).

13. The method of claim 12, including comparing the frequency of occurrence to a threshold value and adjusting the one or more parameters when the frequency of occurrence satisfies the threshold value.

14. The method of claim 11, wherein the statistic includes a standard deviation of a sum of at least a portion of decisions for the LSB repeat bits determined for the P conversions.

15. The method of claim 10, wherein a bit trial includes comparing the sampled input voltage to a reference voltage using a comparator circuit, and wherein adjusting one or more parameters for one or more N-bit trials includes adjusting one or more of a bias current of the comparator circuit, an integration time of a preamplifier of the comparator circuit, and a load capacitance of the preamplifier.

16. An analog-to-digital converter (ADC) circuit comprising:
a digital-to-analog (DAC) circuit including at least N+r weighted circuit components, wherein N and r are positive integers greater than zero, and r is a number of redundant bits of the N bits;
a sampling circuit configured to sample an input voltage at an input to the ADC circuit and apply a sampled voltage to the weighted circuit components;
a comparator circuit configured to compare an output voltage of the DAC circuit to a specified threshold voltage as part of a bit trial; and
logic circuitry configured to:
convert the input voltage to an N-bit digital value using at least N bit trials and r redundant bit trials;
initiate P conversions of input voltages to generate P N-bit digital values, wherein P is a positive integer greater than one (P>1);
calculate a statistic over the P conversions for values of at least one redundant bit and values of a bit determined immediately lower in order than the redundant bit;
compare the statistic to a specified statistic threshold; and
adjust a parameter of a bit trial of one or more bits higher in order than the at least one redundant bit according to the calculated statistic.

17. The ADC circuit of claim 16, wherein the logic circuitry is configured to determine, as the statistic, a number of times that the values of the at least one redundant bit match the values of the bit determined immediately lower in order than the redundant bit.

18. The ADC circuit of claim 17, wherein the logic circuitry is configured to;
compare the determined number of times to a specified threshold value; and
adjust the one or more parameters of the one or more bit trials according to the comparison.

19. The ADC circuit of claim 16, including a settling time timer circuit configured to time a settling time duration of the DAC circuit, and wherein the logic circuitry is configured to adjust the settling time duration according to the calculated statistic.

20. The ADC circuit of claim 16, wherein the logic circuitry is configured to adjust one or more of bias current of the comparator, an integration time of a pre-amplifier included in the comparator, and a load capacitance of the pre-amplifier according to the calculated statistic.

* * * * *